United States Patent
Hou et al.

(10) Patent No.: US 10,056,432 B2
(45) Date of Patent: Aug. 21, 2018

(54) SELF-RECTIFYING RRAM CELL STRUCTURE HAVING TWO RESISTIVE SWITCHING LAYERS WITH DIFFERENT BANDGAPS AND RRAM 3D CROSSBAR ARRAY ARCHITECTURE

(71) Applicant: Winbond Electronics Corp., Taichung (TW)

(72) Inventors: Tuo-Hung Hou, Hsinchu (TW); Chung-Wei Hsu, Taitung (TW); Chun-Tse Chou, New Taipei (TW); Wei-Li Lai, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/731,933

(22) Filed: Jun. 5, 2015

(65) Prior Publication Data

US 2016/0064453 A1  Mar. 3, 2016

(30) Foreign Application Priority Data

Aug. 27, 2014  (TW) .............................. 103129478 A

(51) Int. Cl.
*H01L 27/24* (2006.01)
*H01L 45/00* (2006.01)

(52) U.S. Cl.
CPC .......... *H01L 27/2481* (2013.01); *H01L 45/04* (2013.01); *H01L 45/1233* (2013.01); *H01L 45/1253* (2013.01); *H01L 45/146* (2013.01)

(58) Field of Classification Search
CPC . H01L 27/2481; H01L 45/04; H01L 45/1233; H01L 45/1253; H01L 45/146
See application file for complete search history.

(56) References Cited

U.S. PATENT DOCUMENTS 8,373,149 B2 * 2/2013 Takahashi ........... H01L 27/2436
                                                                257/2
8,658,511 B1 * 2/2014 Fulgenico ......... H01L 21/31122
                                                                438/238

(Continued)

FOREIGN PATENT DOCUMENTS

| CN | 102610616 A | 7/2012 |
| CN | 103872245 A | 6/2014 |
| CN | 103988264 A | 8/2014 |

OTHER PUBLICATIONS https://en.wikipedia.org/wiki/Metalorganic_vapour_phase_epitaxy.*

*Primary Examiner* — Peniel M Gumedzoe
(74) *Attorney, Agent, or Firm* — Muncy, Geissler, Olds & Lowe, P.C.

(57) ABSTRACT

The present disclosure provides a self-rectifying RRAM cell structure including a first electrode layer formed of a nitride of a first metal element, a second electrode layer formed of a second metal element that is different from the first metal element, a first resistive switching layer and a second resistive switching layer. The first resistive switching layer is sandwiched between the first electrode layer and the second resistive switching layer, and the second resistive switching layer is sandwiched between the first resistive switching layer and the second electrode layer. The first resistive switching layer has a first bandgap that is lower than the second bandgap of the second resistive switching layer. Furthermore, a RRAM 3D crossbar array architecture is also provided.

11 Claims, 6 Drawing Sheets

(56) References Cited

U.S. PATENT DOCUMENTS

| | | |
|---|---|---|
| 2013/0034947 A1 | 2/2013 | Hong et al. |
| 2013/0221314 A1* | 8/2013 | Pramanik ................ H01L 45/08 257/4 |
| 2015/0179937 A1* | 6/2015 | Hsueh ................. H01L 45/1616 438/382 |

* cited by examiner

SELF-RECTIFYING RRAM CELL STRUCTURE HAVING TWO RESISTIVE SWITCHING LAYERS WITH DIFFERENT BANDGAPS AND RRAM 3D CROSSBAR ARRAY ARCHITECTURE

CROSS REFERENCE TO RELATED APPLICATIONS

This application claims the benefit of Taiwan Patent Application No. 103129478 filed on Aug. 27, 2014, entitled "SELF-RECTIFYING RRAM CELL STRUCTURE AND RRAM 3D CROSSBAR ARRAY ARCHITECTURE" which is hereby incorporated herein by reference.

BACKGROUND

Field of the Disclosure

The present disclosure relates to a memory device, and in particular, it relates to a resistive random access memory (RRAM) cell structure and a 3D crossbar array thereof.

Description of the Related Art

As the functionality of integrated chips increases, the need for more memory also increases. Designers have been looking to decrease the size of the memory element and stack more memory elements in a unit area to achieve greater capacity and lower costs per bit. In the past few decades, the aggressive shrinkage of memory elements is due to advancements in lithography techniques. Flash memory has been widely used as large-capacity, inexpensive nonvolatile memory which can store data even when it is powered off. In addition, flash memory can achieve high density by using 3D arrays, such as by using vertical NAND memory cell stacking. However, it has been found that further miniaturization of flash memory is limited due to the increasing cost.

Designers are now looking at next-generation nonvolatile memories such as MRAMs (Magnetoresistive Random Access Memory), PCRAMs (Phase Change Random Access Memory), CBRAMs (Conductive Bridging Random Access Memory) and RRAMs (Resistive Random Access Memory), to increase writing speeds and decrease power consumption. Among the nonvolatile memories, the RRAM has the greatest potential to replace flash memories due to its simple structure, simple crossbar array and suitability for low-temperature fabrication. A unit element of the RRAM is composed of only an insulator with two metal electrodes.

Although the RRAM crossbar array architecture is simple, there are still many problems that need to be overcome for fabrication, especially for three-dimensional (3D) crossbar array architectures. Without a vertical 3D architecture, the RRAM will most likely not be able to compete with 3D NAND memories in terms of bit cost for mass data storage.

The RRAM crossbar array architectures based on resistive switching elements theoretically allows for the smallest cell size of $4F^2$ where F is the minimum feature size, and the low-temperature fabrication enables stacking of memory arrays three-dimensionally, for unprecedented high-integration density. However, in the 1R structure (having a resistive element only), undesired sneak current that flows through neighboring unselected memory cells significantly deteriorates the read margin, and limits the maximum size of the crossbar array to below 64 bits. This problem can be mitigated by additional nonlinear selection devices in series with the resistive switching elements. Some memory cell structures, such as one diode-one resistor (1D1R), one bipolar selector-one resistor (1S1R), one MOSFET transistor-one resistor (1T1R), and one bipolar junction transistor-one resistor 1BJT1R memory cell structures, have been developed. Among the memory cell structures, the 1T1R and 1BJT1R memory cell structures are undesirable because of the complicated and high-temperature fabrication requirements of MOSFETs and BJTs, while the complementary resistive switching (CRS) memory cell structure suffers from the issue of destructive read. Hence, the 1D1R and 1S1R memory cell structures appear to be the leading contenders for the 3D crossbar array architectures.

However, the 3D crossbar array architectures of the 1D1R or 1S1R memory cell structures still cannot be successfully fabricated. The 1D1R and 1S1R memory cell structures are basically formed of a metal-insulator-metal-insulator-metal (MIMIM) structure. FIG. 1 shows an exemplary scheme of an ideal RRAM 3D crossbar array architecture including 1D1R and 1S1R memory cell stacked structures. The MIMIM structure of the 1D1R or 1S1R memory cell structures is formed between the conductive lines 102 and 104 along the horizontal longitude 106 perpendicular to sidewalls of the conductive lines 102 and 104. However, the RRAM 3D crossbar array architecture is usually formed within a semiconductor substrate. After the formation of the conductive lines 102, lithography processes can only be performed from the direction 110. Performing the lithography processes from the direction 110 will not form the patterned metal layer 108 shown in FIG. 1, which eliminates application for the 3D crossbar array architectures through the 1D1R and 1S1R memory cell structures.

SUMMARY

In some embodiments of the disclosure, a self-rectifying RRAM cell structure is provided, including: a first electrode layer formed of a nitride of a first metal element; a second electrode layer formed of a second metal element that is different from the first metal element; and a first resistive switching layer and a second resistive switching layer. The first resistive switching layer is sandwiched between the first electrode layer and the second resistive switching layer, and the second resistive switching layer is sandwiched between the first resistive switching layer and the second electrode layer. The first resistive switching layer has a first bandgap that is lower than a second bandgap of the second resistive switching layer.

In some embodiments of the disclosure, a RRAM 3D crossbar array architecture is provided, including: a group of horizontal parallel conductive lines formed of a nitride of a first metal element; a group of vertical parallel conducive lines formed of a second metal element that is different from the first metal element; and a first resistive switching layer and a second resistive switching layer formed on sidewalls of each horizontal conductive line and in contact with the vertical conductive lines, wherein the first resistive switching layer has a first bandgap that is lower than a second bandgap of the second resistive switching layer.

A detailed description is given in the following embodiments with reference to the accompanying drawings.

BRIEF DESCRIPTION OF THE DRAWINGS

The present disclosure can be further understood by reading the subsequent detailed description and examples with references made to the accompanying drawings, wherein.

DETAILED DESCRIPTION

Figure 1:
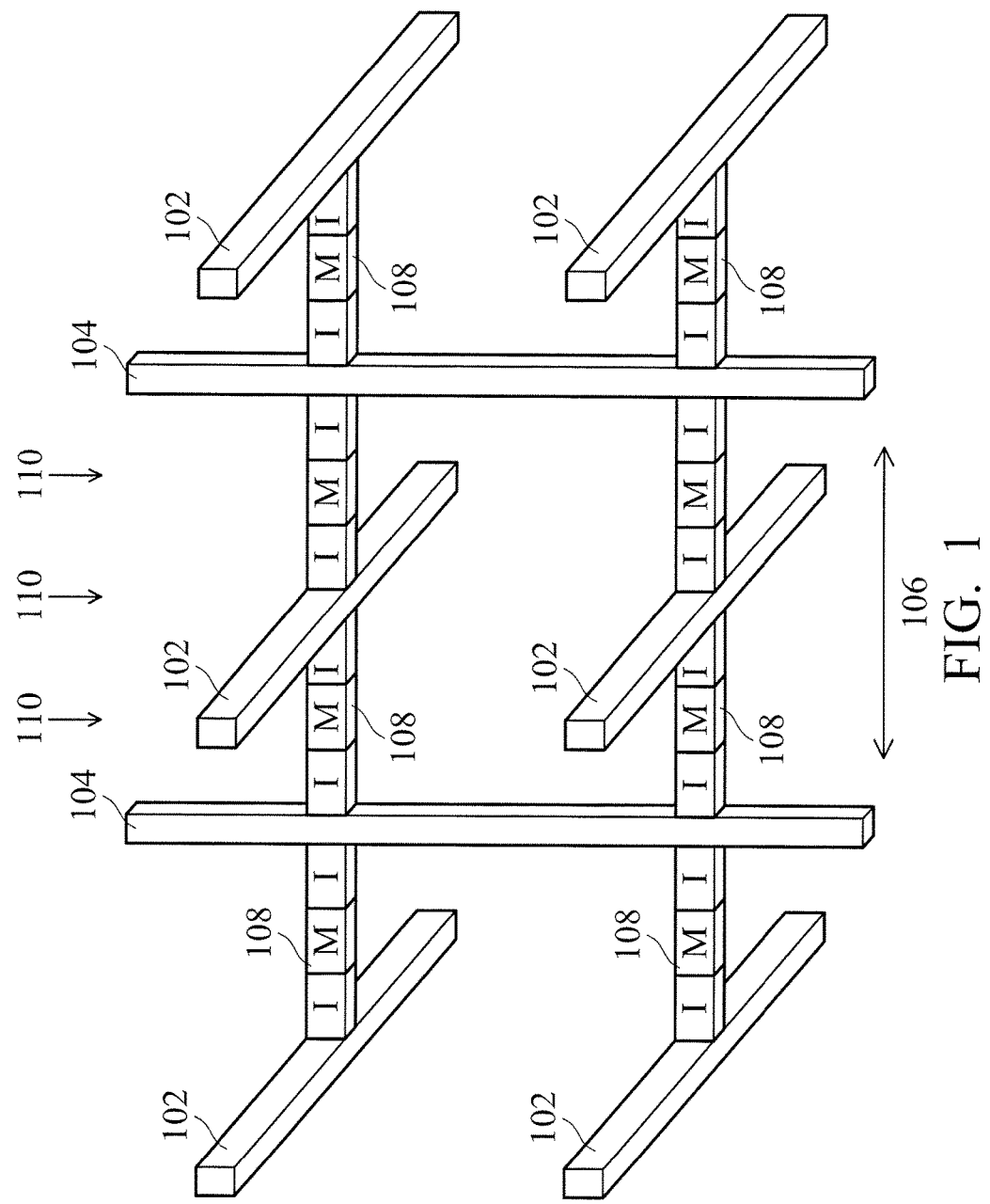
FIG. 1 shows an stereoscopic view of a RRAM 3D crossbar array architecture with 1D1R or 1S1R memory cell structures.

The following description is of the best-contemplated mode of carrying out the disclosure. This description is made for the purpose of illustrating the general principles of the disclosure and should not be taken in a limiting sense. These are, of course, merely examples and are not intended to be limited. For example, the formation of a first feature over, above, below, or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

The disclosure provides a RRAM cell structure without a selection device while showing self-rectifying or self-selecting characteristics similar to the RRAM having the 1D1R or 1S1R memory cell structure. In addition, the RRAM cell structure of the disclosure may be applicable to a 3D RRAM crossbar array architecture.

Figure 2:
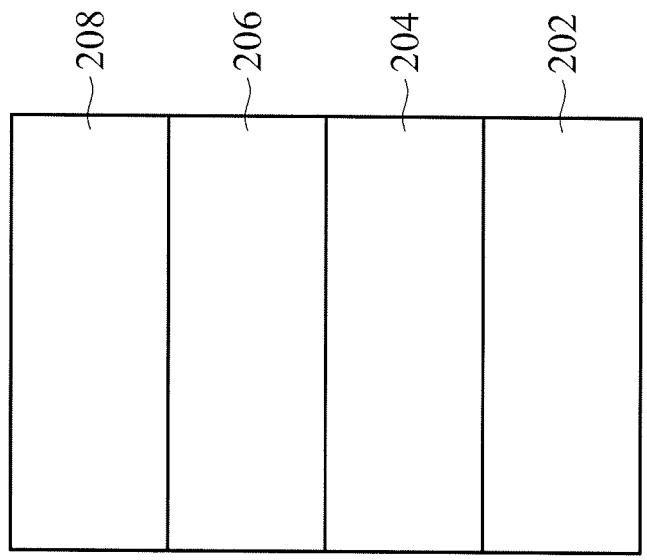
FIG. 2 shows a cross section of a RRAM cell structure according to an embodiment of the disclosure.

FIG. 2 shows a memory cell structure of a resistive random access memory (RRAM) according to an embodiment of the disclosure. The memory cell structure of the RRAM includes a first electrode layer 202, a first resistive switching layer 204, a second resistive switching layer 206 and a second electrode layer 208. The first resistive switching layer 204 and the second resistive switching layer 206 may be sandwiched between the first electrode layer 202 and the second electrode layer 208. In some embodiments, the first resistive switching layer 204 may abut the first electrode layer 202, and the second resistive switching layer 206 may adjacently connect to the second electrode layer 208.

The first electrode layer 202 may comprise a metal element. In an embodiment, an oxide of the metal element of the first electrode layer 202 may be an insulator material having a lower relative bandgap. The second electrode layer 208 may comprise another metal element that is different from the metal element of the first electrode layer 202. In addition, an oxide of another metal element of the second electrode layer 208 may be an insulator having a higher relative bandgap. The metal elements of the first electrode layer 202 and the second electrode layer 208 may be selected from the group consisting of Ti, Ta, Ni, Cu, W, Hf, Zr, Nb, Y, Zn, Co, Al, Si, Ge and their alloys. For example, in an embodiment, the first electrode layer 202 may be formed of Ti, and the second electrode layer 208 may be formed of Ta. In another embodiment, the first electrode layer 202 may be formed of Ta, and the second electrode layer 208 may be formed of Hf.

In another embodiment of the disclosure, the first electrode layer 202 may consist of a nitride of a metal element. For example, the first electrode layer 202 may be a TiN layer. In addition, the second electrode layer 208 may be a Ta layer. Compared to the electrode layers consisting of pure metal elements (for example, Ti), the electrode layers made of a nitride of metal elements (for example, TiN) have better anti-oxidizing properties.

The first resistive switching layer 204 may be formed of an insulator having a first bandgap. The second resistive switching layer 206 may be an insulator, having a second bandgap that is higher than the first bandgap of the first resistive switching layer 204. In an embodiment, the first bandgap and the second bandgap may be between about 1 eV and about 9 eV. In some embodiments, the second bandgap may be higher than the first bandgap by more than 0.5 eV.

In some embodiments, the first resistive switching layer 204 may be an oxide of the metal element of the first electrode layer 202, and the second resistive switching layer 206 may be an oxide of the metal element of the second electrode layer 208. For example, in an embodiment, the first resistive switching layer 204 consists of $TiO_2$ while the first electrode layer 202 is a Ti layer or a TiN layer. In addition, the second resistive switching layer 206 consists of $Ta_2O_5$ while the second electrode layer 208 is a Ta layer. In another embodiment, the first resistive switching layer 204 consists of $Ta_2O_5$ while the first electrode layer 202 is a Ta layer. In addition, the second resistive switching layer 206 consists of $HfO_2$ while the second electrode layer 208 is a Hf layer. All of the materials of the various layers of the RRAM cell structure described above can be selected from among the materials used widely in the industry.

In an embodiment, the first resistive switching layer 204 may be formed by directly oxidizing the outer portions of the first electrode layer 202. For example, the first resistive switching layer 204 may be directly formed from the first electrode layer 202 by thermal oxidation or laser oxidation. In other embodiments, the first resistive switching layer 204 may be formed by any suitable deposition method, such as atom layer deposition (ALD), chemical vapor deposition (CVD), plasma enhanced chemical vapor deposition (PECVD), metal-organic chemical vapor deposition (MOCVD), physical vapor deposition (PVD) or other suitable deposition methods. The second resistive switching layer 206 may be formed by any suitable deposition method, such as atom layer deposition (ALD), chemical vapor deposition (CVD), plasma enhanced chemical vapor deposition (PECVD), metal-organic chemical vapor deposition (MOCVD) or physical vapor deposition (PVD) or other suitable deposition methods. In some embodiments, the first resistive switching layer 204 may have a thickness of between about 1 nm and about 80 nm. The second resistive switching layer 206 may have a thickness of between about 1 nm and about 80 nm.

Figure 3:
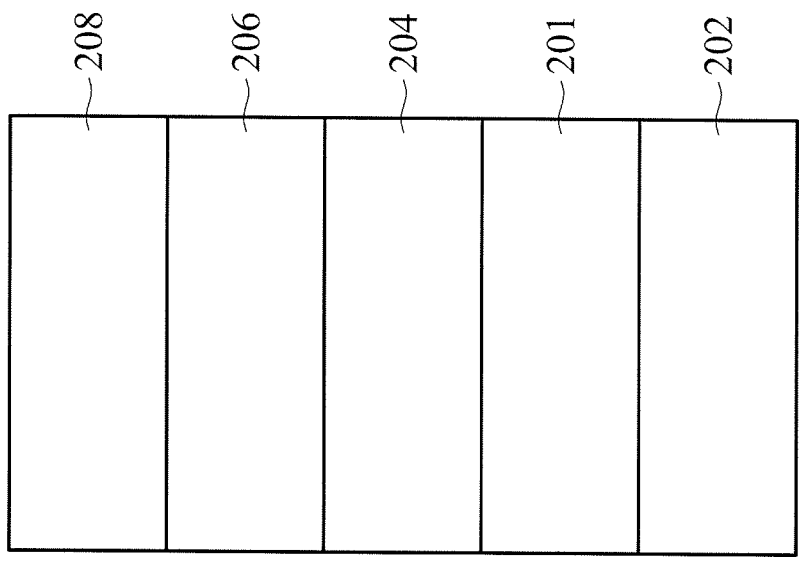
FIG. 3 shows a cross section of a RRAM cell structure according to another embodiment of the disclosure.

Refer to FIG. 3, which shows a RRAM cell structure according to another embodiment of the disclosure. The embodiment is similar to the structure disclosed in FIG. 2, and the difference is that the RRAM cell structure of this embodiment further includes a third resistive switching layer 201 sandwiched between the first electrode layer 202 and the first resistive switching layer 204. In this embodiment, the third resistive switching layer 201 is a non-stoichiometric oxide of the metal element of the first electrode layer 202, and the first resistive switching layer 204 is a stoichiometric oxide of the metal element of the first electrode layer 202. For example, the first resistive switching layer 204 is a $TiO_2$ layer and the third resistive switching layer 201 is a $TiO_x$ layer, wherein $0<x<2$, while the first electrode layer 202 is a Ti layer or a TiN layer. The aforementioned disposition of the third resistive switching layer 201 is helpful for reducing the Schottky barrier between the first resistive switching layer 204 and the first electrode layer 202 to form an ohmic contact and further to achieve the desired bipolar resistive switching (BRS) characteristics.

Furthermore, the RRAM cell structures of the disclosure have the characteristics of having self-compliance and being self-rectifying. The current is rectified at the positive polarity and the sneak current is greatly suppressed. For example, the RRAM cell structure of the disclosure may have a current compliance level of less than about $10^{-2}$. The RRAM cell structure may have a current rectification ratio (i.e., the ratio of the current compliance level to the rectification current level) of greater than $10^4$ at $\pm 2$ V of bias voltage. In some embodiments, the current toward the second electrode layer 208 may be rectified by the second resistive switching layer 206 when the current flows thereto since the second resistive switching layer 206 has a higher bandgap than that of the first resistive switching layer 204. The current that flows toward the first electrode layer 202 may easily pass through the first resistive switching layer 204.

Therefore, the above mentioned RRAM cell structures are merely a 1R memory cell structure that has similar properties to that of a conventional resistor connected to a unidirectional selector such as the 1T1R, 1D1R, 1S1R and 1BJT1R RRAM cell structures. In addition, the RRAM cell structure mentioned above is not required for an initial forming step. The RRAM cell structure may be activated without applying an initial forming voltage. The initial forming voltage may sometimes damage the RRAM cell structure due to its high magnitude. Accordingly, the initial forming step-free RRAM cell structure has better reliability.

Figure 4:
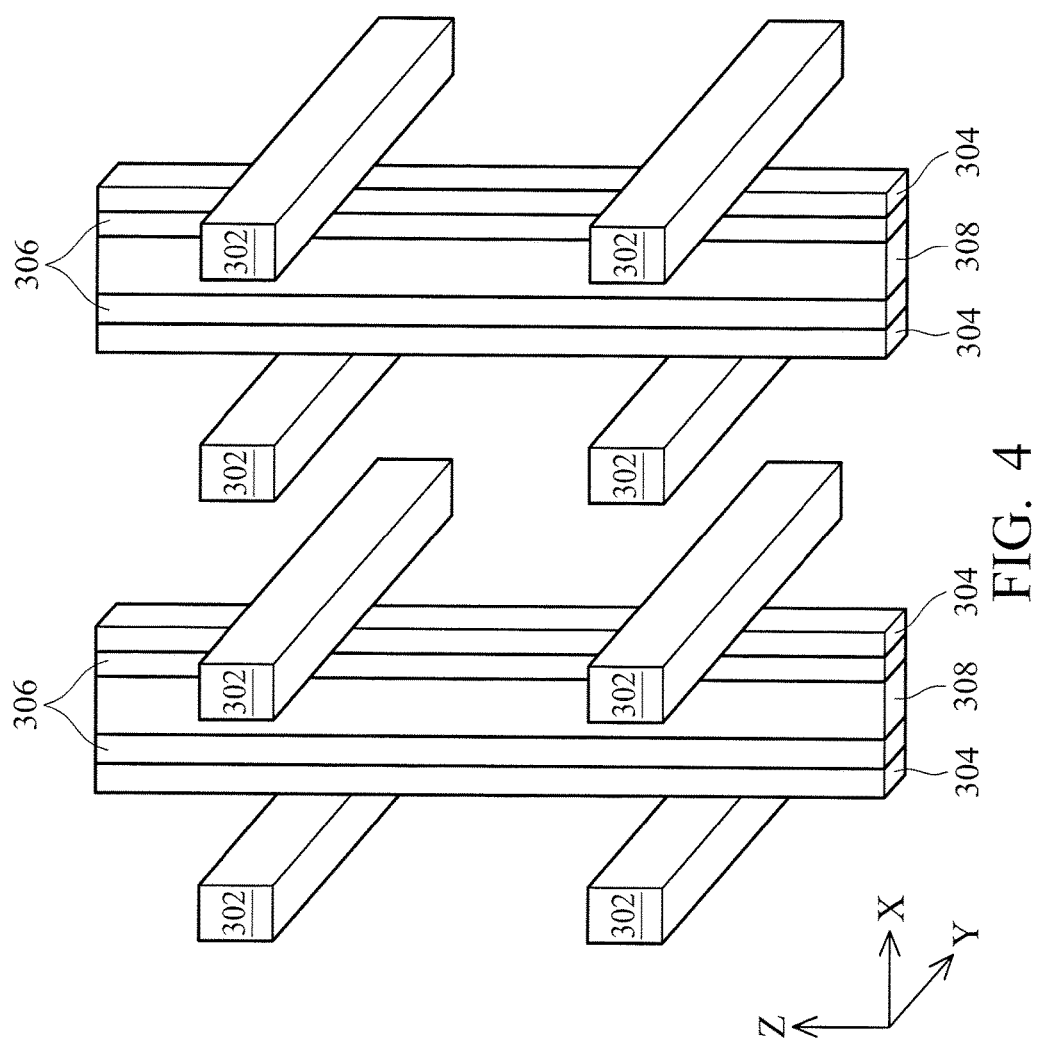
FIG. 4 shows a stereoscopic view of a RRAM 3D crossbar array architecture according to an embodiment of the disclosure.

FIG. 4 shows a RRAM cell structure applied to a 3D crossbar array architecture according to an embodiment of the disclosure. The RRAM 3D cross bar array architecture may comprise a group of horizontal parallel conductive lines 302 (e.g., extending along the Y longitude of FIG. 4), and a group of vertical parallel conductive lines 308 (e.g., extending along the Z longitude of FIG. 4). An array of RRAM cell structures is formed between the intersections of the group of horizontal parallel conductive lines 302 and the group of vertical parallel conductive lines 308. Each of the RRAM cell structures may be disposed along a horizontal direction (e.g., extending along the X longitude of FIG. 4) perpendicular to the extending directions of the group of horizontal conductive lines 302 and the group of vertical conductive lines 308.

In an embodiment, the group of horizontal parallel conductive lines 302 may be used as the first electrode layer of the RRAM cell structures, and the group of vertical parallel conductive lines 308 may be used as the second electrode layer of the RRAM cell structures. The group of horizontal parallel conductive lines 302 and the group of vertical parallel conductive lines 308 may respectively be formed of the same or similar materials of the first electrode layer 202 and the second electrode layer 208 described in the above embodiments. Alternatively, the group of horizontal parallel conductive lines 302 and the group of vertical parallel conductive lines 308 may respectively be fainted of the same or similar materials of the second electrode layer 208 and the first electrode layer 202 described in the above embodiments. In an embodiment, the group of horizontal conductive lines 302 may be a bit line, and the group of vertical conductive lines 308 may be a word line, or vice versa.

A first resistive switching layer 304 and a second resistive switching layer 306 are located between the horizontal conductive lines 302 and the vertical conductive lines 308, and the first resistive switching layer 304 and the second resistive switching layer 306 may be formed on sidewalls of the vertical conductive lines 308. In which, the first resistive switching layer 304 may contact the horizontal conductive lines 302 and the second resistive switching layer 306 may contact the vertical conductive lines 308. In other words, each of the RRAM cell structures is formed at the locations where the first resistive switching layer 304 and the second resistive switching layer 306 are in direct contact with each other. In an embodiment, the first resistive switching layer 304 and the second resistive switching layer 306 may respectively be formed of the same or similar materials as the first resistive switching layer 204 and the second resistive switching layer 206 described in the above embodiments when the horizontal conductive lines 302 and the vertical conductive lines 308 are respectively formed of the same or similar materials as the first electrode layer 202 and the second electrode layer 208 described in the above embodiments. Alternatively, the first resistive switching layer 304 and the second resistive switching layer 306 may respectively be formed of the same or similar materials as the second resistive switching layer 206 and the first resistive switching layer 204 described in the above embodiments when the horizontal conductive lines 302 and the vertical conductive lines 308 are respectively formed of the same or similar materials as the second electrode layer 208 and the first electrode layer 202 described in the above embodiments. In some embodiments, the RRAM cell structure for the 3D crossbar array architecture is formed within a semiconductor substrate.

Figure 5:
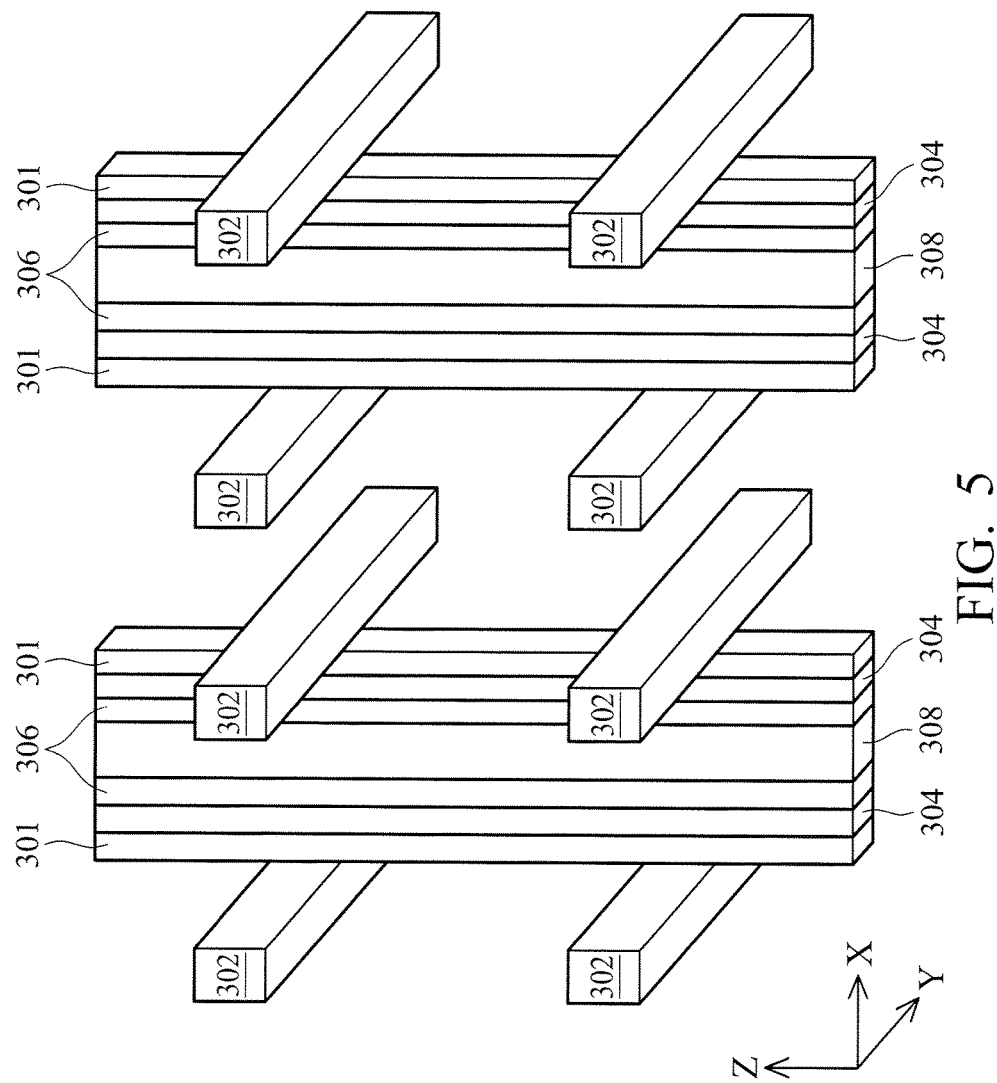
FIG. 5 shows a stereoscopic view of a RRAM 3D crossbar array architecture according to another embodiment of the disclosure.

Refer to FIG. 5, which shows a RRAM cell structure applied to a 3D crossbar array architecture according to another embodiment of the disclosure. The difference between this embodiment and that of FIG. 4 is that the RRAM cell structure of this embodiment further includes a third resistive switching layer 301 sandwiched between the first resistive switching layer 304 and the horizontal conductive lines 302. In this embodiment, the first resistive switching layer 304, the second resistive switching layer 306 and the third resistive switching layer 301 may respectively be formed of the same or similar materials as the first resistive switching layer 204, the second resistive switching layer 206, and the third resistive switching layer 201 described in the above embodiments when the horizontal conductive lines 302 and the vertical conductive lines 308 are respectively formed of the same or similar materials as the first electrode layer 202 and the second electrode layer 208 described in the above embodiments.

It will be appreciated that the disclosure is not limited to the configurations mentioned above. In other embodiments, the third resistive switching layer 301 may also be sandwiched between the second resistive switching layer 306 and the vertical conductive lines 308 (not illustrated) when the horizontal conductive lines 302 and the vertical conductive lines 308 are respectively formed of the same or similar materials as the second electrode layer 208 and the first electrode layer 202 described in the above embodiments. In this embodiment, the first resistive switching layer 304, the second resistive switching layer 306 and the third resistive switching layer 301 may respectively be formed of the same or similar materials as the second resistive switching layer 206, the first resistive switching layer 204, and the third resistive switching layer 201 described in the above embodiments.

As shown in FIGS. 4 and 5, the RRAM 3D crossbar array architectures only include 1R memory cell structures. Therefore, the RRAM 3D crossbar array architecture may be fabricated easily since the 1R memory cell structures do not require an inter-metal layer. The problem of sneak current occurring in the 1R memory cell structures of the conventional RRAM 3D crossbar array may be overcome because the 1R memory cell structures of the disclosure having characteristics such as self-compliance and being self-rectifying. Therefore, the RRAM 3D crossbar array architecture according to the disclosure can be used as a next-generation nonvolatile memory and has great potential to replace flash memory devices.

Figure 6:
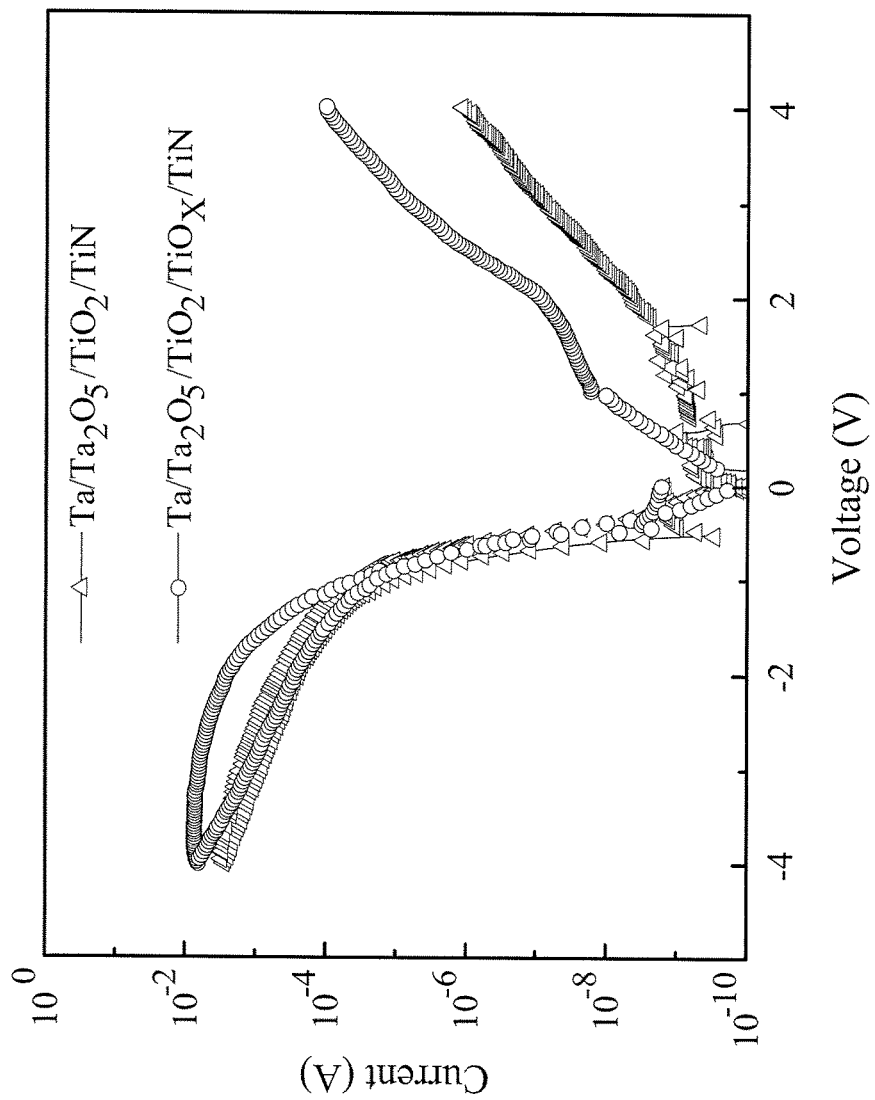
FIG. 6 shows a current-versus-voltage diagram of a RRAM cell structure according to some embodiments of the disclosure.

FIG. 6 shows a current-versus-voltage diagram of the RRAM according to some embodiments of the disclosure. In an embodiment, the RRAM is formed of a Ta layer, a $Ta_2O_5$ layer, a $TiO_2$ layer, and a TiN layer which are stacked in order. In another embodiment, the RRAM is formed of a Ta layer, a $Ta_2O_5$ layer, a $TiO_2$ layer, a TiOx layer, and a TiN layer which are stacked in order, wherein 0<x<2.

As shown in FIG. 6, the RRAMs of the embodiments of the disclosure clearly show self-rectification characteristics. In addition, the RRAMs may be placed in a set state by applying a positive voltage, and a reset state by applying a negative voltage, which shows that the RRAMs according to the disclosure are a bipolar resistive switching memory. The RRAMs can be placed in the set state and the reset state by a minimum voltage of about +4 V and −4 V, respectively (±2 V is used to read and not to set/reset the device). It can also be found that the RRAM of the disclosure may have a current compliance level below $10^{-2}$ when the negative voltage is increased, even to −4 V.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A self-rectifying RRAM cell structure, comprising:
a first electrode layer formed of a nitride of a first metal element;
a first resistive switching layer disposed on the first electrode layer, wherein the first resistive switching layer is formed of an oxide of the first metal element;
a second resistive switching layer disposed on the first resistive switching layer, wherein the first resistive switching layer has a first bandgap that is lower than a second bandgap of the second resistive switching layer;
a second electrode layer disposed on the second resistive switching layer and formed of a second metal element that is different from the first metal element, wherein the second resistive switching layer is formed of an oxide of the second metal element; and
a third resistive switching layer sandwiched between the first resistive switching layer and the first electrode layer, wherein the third resistive switching layer is a non-stoichiometric oxide of the first metal element, and the first resistive switching layer is a stoichiometric oxide of the first metal element.

2. The self-rectifying RRAM cell structure as claimed in claim 1, wherein the first metal element and the second metal element are respectively selected from a group consisting of Ti, Ta, Ni, Cu, W, Hf, Zr, Nb, Y, Zn, Co, Al, Si, Ge and their alloys.

3. The self-rectifying RRAM cell structure as claimed in claim 1, wherein the first resistive switching layer is a $TiO_2$ layer, the second resistive switching layer is a $Ta_2O_5$ layer, and the third resistive switching layer is a $TiO_x$ layer, wherein 0<x<2.

4. The self-rectifying RRAM cell structure as claimed in claim 1, wherein the self-rectifying RRAM cell structure is a bipolar resistive switching memory.

5. The self-rectifying RRAM cell structure as claimed in claim 1, wherein the second bandgap is higher than the first bandgap by more than about 0.5 eV.

6. A RRAM 3D crossbar array architecture, comprising:
a group of horizontal parallel conductive lines formed of a nitride of a first metal element;
a group of vertical parallel conducive lines formed of a second metal element that is different from the first metal element;
a first resistive switching layer and a second resistive switching layer formed on sidewalls of each of the horizontal parallel conductive line and in contact with the group of vertical parallel conductive lines, wherein the first resistive switching layer has a first bandgap that is lower than a second bandgap of the second resistive switching layer, and wherein the first resistive switching layer consists of an oxide of the first metal element, and the second resistive switching layer consists of an oxide of the second metal element; and
a third resistive switching layer disposed between the first resistive switching layer and the horizontal parallel conductive lines that correspond to the first resistive switching layer, wherein the third resistive switching layer is a non-stoichiometric oxide of the first metal element, and the first resistive switching layer is a stoichiometric oxide of the first metal element.

7. The RRAM 3D crossbar array architecture as claimed in claim 6, wherein the first resistive switching layer is a $TiO_2$ layer, the second resistive switching layer is a $Ta_2O_5$ layer, and the third resistive switching layer is a $TiO_x$ layer, wherein 0<x<2.

8. The RRAM 3D crossbar array architecture as claimed in claim 6, wherein the first metal element and the second metal element are respectively selected from a group consisting of Ti, Ta, Ni, Cu, W, Hf, Zr, Nb, Y, Zn, Co, Al, Si, Ge and their alloys.

9. The RRAM 3D crossbar array architecture as claimed in claim 6, wherein the second bandgap is higher than the first bandgap by more than about 0.5 eV.

10. The RRAM 3D crossbar array architecture as claimed in claim 6, wherein the group of horizontal parallel conductive lines are bit lines, and the group of vertical parallel conductive lines are word lines.

11. The RRAM 3D crossbar array architecture as claimed in claim 6, wherein the group of horizontal parallel conductive lines are word lines, and the group of vertical parallel conductive lines are bit lines.

* * * * *